United States Patent [19]

Shiba et al.

[11] 4,268,609

[45] May 19, 1981

[54] PROCESS FOR PREPARING PHOTOSENSITIVE LITHOGRAPHIC PRINTING PLATE PRECURSOR

[75] Inventors: Keisuke Shiba; Tadao Toyama; Sho Nakao, all of Shizuoka, Japan

[73] Assignee: Fuji Photo Film Co., Ltd., Minami-ashigara, Japan

[21] Appl. No.: 169,253

[22] Filed: Jul. 16, 1980

[30] Foreign Application Priority Data

Jul. 16, 1979 [JP] Japan .................................. 54-90053
Sep. 26, 1979 [JP] Japan ................................ 54-124482

[51] Int. Cl.³ ............................................. G03C 1/76
[52] U.S. Cl. .................................... 430/271; 430/273; 430/156; 430/278; 430/302; 430/502; 430/503
[58] Field of Search ............... 430/271, 273, 278, 302, 430/503, 502, 156

[56] References Cited

U.S. PATENT DOCUMENTS

| T870,022 | 1/1970 | Kenyon et al. | 430/302 |
|---|---|---|---|
| 3,245,793 | 4/1966 | Smith | 430/503 |
| 3,274,929 | 9/1966 | Newman | 430/302 |
| 3,511,661 | 5/1970 | Rauner et al. | 430/302 |
| 4,221,858 | 9/1980 | Shiba et al. | 430/302 |

*Primary Examiner*—Jack P. Brammer
*Attorney, Agent, or Firm*—Sughrue, Rothwell, Mion, Zinn and Macpeak

[57] ABSTRACT

A process for preparing a photosensitive lithographic printing plate precursor wherein a layer containing a water-insoluble lipophilic resin is disposed on a support having a hydrophilic surface, the coating of a silver halide emulsion is directly applied to said layer and dried, said coating of silver halide emulsion is dried with hot air at 60° to 150° C. without permitting the same to set.

6 Claims, No Drawings

PROCESS FOR PREPARING PHOTOSENSITIVE LITHOGRAPHIC PRINTING PLATE PRECURSOR

BACKGROUND OF THE INVENTION

1. Field of the Invention

This invention relates to a process for preparing a photosensitive lithographic printing plate precursor (also known as a presensitized plate or a PS plate in short). More particularly, the invention relates to an improved process for preparing a photosensitive lithographic printing plate precursor wherein a silver halide emulsion layer is directly applied to a layer containing a lipophilic resin and dried.

2. Description of the Prior Art

U.S. Pat. No. 3,511,661, Japanese Patent Application (OPI) No. 37804/79 (the term "OPI" as used herein refers to a "published unexamined Japanese patent application") as well as German Patent Application (OLS) Nos. 2,517,711 and 2,640,763 teach a photosensitive lithographic printing plate precursor wherein an ultraviolet sensitive layer conventionally used as a photosensitive layer for PS plates and containing a diazo compound or photopolymer and a silver halide emulsion layer are disposed, in sequence, on a support, such as an aluminum plate, having a hydrophilic surface. But the ultraviolet sensitive layer is water-repellent rather than hydrophobic and does not provide satisfactorily strong bond with a silver halide emulsion layer directly disposed on it. Therefore, during the photomechanical processing of such precursor to make a photosensitive lithographic printing plate (for example, during the development of a silver halide emulsion layer), the emulsion layer can separate from the ultraviolet sensitive layer, and a commercially acceptable product may not be obtained. To eliminate these defects, the provision of an interlayer between the UV sensitive layer and silver halide emulsion layer has been proposed in, for example, U.S. Pat. No. 3,245,793 and U.S. Defensive Patent Publication No. T. 870,022. However, even such interlayers may not provide adequate bond between the UV sensitive layer and emulsion layer, or they may provide so strong a bond that the subsequent removal of the emulsion layer throughout, or in the non-image areas, become difficult. As a result, the lithographic printing plate obtained easily forms stain in the non-image area and provides an image area low in lipid-sensitivity (i.e., the property to receive oily ink). What is more, the provision of such an interlayer adds to production costs, because it requires separate coating and drying steps.

SUMMARY OF THE INVENTION

Therefore, one object of this invention is to provide a process for preparing a photosensitive lithographic printing plate precursor having a silver halide emulsion layer bonded in a desired strength onto a non-silver photosensitive layer capable of forming a lipophilic image.

Another object of this invention is to provide a process for preparing a photosensitive lithograhic printing plate precursor having a silver halide emulsion layer bonded in a suitable strength onto a non-silver photosensitive layer capable of forming a lipophilic image without an intervening interlayer.

A further object of this invention is to provide a photosensitive lithographic printing plate precursor which comprises a silver halide emulsion layer directly disposed on a non-silver photosensitive layer capable of forming a lipophilic image, said emulsion layer remaining adequately bonded to the layer beneath it during the process of development and being removable throughout or in the non-image area upon a subsequent processing and a process for preparation thereof.

The inventors of this invention have made various studies to achieve these objects and have successfully reached the desired process for preparing a photosensitive lithographic printing plate precursor wherein a non-silver photosensitive layer capable of forming a lipophilic image is disposed on a support having a hydrophilic surface. According to the process for preparing a plate precursor according to the invention, the coating of a silver halide emulsion layer is dried with hot air at 60° to 150° C. without permitting the same to set.

DETAILED DESCRIPTION OF THE INVENTION

The general method of drying a layerwise coating of gelatin silver halide emulsion comprises first cooling the emulsion to set and drying it with air blown at a temperature low enough to avoid the melting of the emulsion layer. If this method is used to apply the coating of gelatin silver halide emulsion onto the non-silver photosensitive layer, the bond between the two layers is not very strong, and the emulsion layer easily separates from the other layer during photomechanical processing, and in an extreme case, the separation occurs during drying step.

If, on the other hand, the coating of a gelatin silver halide emulsion is applied and dried according to the process of this invention, a good bond is provided between the emulsion layer and the non-silver photosensitive layer and the following advantages result: the applied emulsion layer does not separate from the non-silver photosensitive layer during the process of development with a silver halide developer but it can be removed throughout or in the non-image area by a subsequent treatment, for example, treatment with hot air at a temperature between, e.g., 40° to 60° C. In addition, the immediate drying of the gelatin silver halide emulsion layer with hot air without permitting it to set achieves high efficiency in drying, requires simpler production equipment and process control and consumes drammatically less energy for drying as compared with the conventional method that permits the emulsion layer to set before drying.

If the step of drying the silver halide emulsion layer according to this invention is followed by a separate moisturizing step using steam, an even stronger bond is obtained between the non-silver photosensitive layer and the silver halide emulsion layer, thus providing a photosensitive lithographic printing plate precursor that undergoes still less change in the quality of the photosensitive layer upon storage.

The components of the photosensitive lithographic printing plate precursor of this invention are described hereinafter. Any support for a lithographic printing plate can be used in this invention if it has a hydrophilic surface. Suitable supports include paper, plastic (e.g., polyethylene, polypropylene, and polystyrene) laminated paper, plates of metals such as aluminum (including aluminum alloys), zinc, iron and copper, films of plastics such as cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate, and polyvinyl acetal, and paper or plastic films laminated or metallized with the above identified metals. An aluminum plate or a composite sheet wherein an aluminum sheet is combined with a plastic film is preferably used.

To provide a hydrophilic surface, these supports are optionally subjected to a surface treatment or other treatments to provide a hydrophilic layer. Various methods are known to render the surface of the support hydrophilic. Methods applicable to a support having a plastic surface include "surface treatments" such as chemical treatment, discharge treatment, flame treatment, ultraviolet treatment, high frequency treatment, glow discharge treatment, active plasma treatment and laser treatment, as described, for example, in U.S. Pat. Nos. 2,764,520, 3,497,407, 3,145,242, 3,376,208, 3,072,483, 3,475,193, 3,360,448, and British Pat. No. 788,365. If necessary, these surface treatments may be followed by the provision of a hydrophilic layer, as described in U.S. Pat. No. 2,649,373 and Japanese Patent Application (OPI) Nos. 40890/78 and 61643/78.

Surface treatments preferably applied to a support having an aluminum surface include such surface treatments as graining, immersion in an aqueous solution of sodium silicate, potassium fluorozirconate, and phosphate salt, and anodization. For instance, an aluminum plate is, as described in U.S. Pat. No. 2,714,066, immersed in an aqueous solution of sodium silicate after graining, and an aluminum plate which is, as described in U.S. Pat. No. 3,181,461, immersed in an aqueous solution of an alkali metal silicate after anodization are used with advantage. The anodization treatment can be carried out by passing an electric current through an aluminum anode in an electrolyte comprising one or more aqueous or non-aqueous solutions of inorganic acids such as phosphoric acid, chromatic acid, sulfuric acid, boric acid or organic acids such as oxalic acid, sulfamic acid, or salts thereof, preferably in an electroylte composed of phosphoric acid, sulfuric acid or a mixture thereof. Silicate electrodeposition as described in U.S. Pat. No. 3,658,662 is also effective as a means for rendering an aluminum plate hydrophilic. Another preferred aluminum plate is described in British Pat. No. 1,208,224 wherein an aluminum plate is first electrolyzed with alternating current in an electrolyte composed of hydrochloric acid and is then anodized in an electrolyte composed of sulfuric acid. The aluminum plate anodized in the method described above may be provided with a subbing layer of a cellulosic resin containing a water-soluble salt of a metal such as zinc, as described in U.S. Pat. No. 3,860,426. The subbing layer is effective in preventing the formation of scum during the printing operation.

The non-silver photosensitive layer (i.e., not containing silver in metallic or salt form) to be disposed on these supports and which is capable of forming a lipophilic image includes one used in a photosensitive lithographic printing plate precursor (also known as a presensitized plate or PS plate in short). The term "lipophilic" of "lipophilic image" refers to the property of repelling damping water used in printing operation and receive oily ink. Various compositions that can constitute such a photosensitive layer are well known in the art and are described in detail in the published British Patent Application GB 2,030,309 A.

Of these, compositions an o-quinonediazide compound are preferred. Particularly preferred o-quinonediazide compounds are o-naphthoquinonediazide compounds, which are described in, for example, U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709, and 3,647,443. Many other publications illustrate o-quinonediazide compounds that can be used in this invention with advantage. Particularly preferred are o-naphthoquinonediazidesulfonate ester or o-naphthoquinonediazidecarboxylate ester of aromatic hydroxy compounds as well as o-naphthoquinonediazidesulfonic acid amide or o-naphthoquinonediazidecarboyxlic acid amide of aromatic amino compounds. Particularly effective compounds include a condensate of pyrogallol and acetone that is esterified with o-naphthoquinonediazidesulfonic acid as described in U.S. Pat. No. 3,635,709; a polyester having an end hydroxyl group that is esterified with o-napththoquinonediazidesulfonic acid or o-naphthoquinonediazidecarboxylic acid as described in U.S. Pat. No. 4,028,111, and a homopolymer of p-hydroxystyrene or a copolymer of p-hydroxystyrene and another copolymerizable monomer that is esterified with o-naphthoquinonediazidesulfonic acid or o-napththoquinonediazidecarboxylic acid as described in British Pat. No. 1,494,043.

These o-quinonediazide compounds may be used independently, but they are preferably used in combination with an alkali-soluble resin. Suitable alkali-soluble resins incude phenolic novolak resins illustrated by a phenol-formaldehyde resin, o-cresol-formaldehyde resin and m-cresol-formaldehyde resin. More preferably, as described in U.S. Pat. No. 4,123,279, these phenolic resins are used in combination with a condensate of formaldehyde with a phenol or cresol substitued by an alkyl group of from 3 to 8 carbon atoms, such as t-butylphenolformaldehyde resin. The alkali-soluble resin is contained in an amount of from about 50 to 85%, and preferably from 60 to 80%, based on the total weight of the photosensitive resist-forming composition.

If desired, the photosensitive composition containing the o-quinonediazide compound may further contain a pigment, dye or plasticizer.

These compositions can be applied from a solution in an organic sovlent by a conventional coating method to provide a dry weight in the range of from about 10.1 g to 5 g/m$^2$.

A silver halide emulsion layer is directly disposed on the non-silver photosensitive layer. The silver halide emulsion to be used in this invention comprises silver bromide, silver chloride, silver iodide or a mixture thereof dispersed in hydrophilic protective colloids such as gelatin; gelatin derivatives of the type described in U.S. Pat. Nos. 2,594,293, 2,614,928, 2,763,639, 2,831,767, 3,118,766, 3,186,846 and Japanese Patent Publication Nos. 5514/64 and 26845/67; casein, sodium alginate, cellulose derivatives, polyvinyl alcohol having acetal groups formed therein, polyvinyl pyrrolidone, polyacrylaminde, polyvinyl imidazole, and polyvinyl pyrazole, and copolymers thereof. Preferably, grains of a mixture of silver halides having an average size of from 0.01 to 2 microns are dispersed in a protective colloid containing at least gelatin or a gelatin derivative. Silver halide grains may be unsensitized or provided with a suitable sensitivity by chemical sensitization such as sulfur sensitization, reduction sensitization or sensitization with a salt of noble metal such as iridium, rhodium, platinum and gold, or spectral sensitization with a sensitizing or desensitizing dye. The grains may have a latent image distribution that provides either a surface latent image or internal latent image. As described in Glafikides, *Chimie Photographique*, Paul Montel, 1957, these grains are prepared by ammoniacal, neutral or acidic method, or by sngle-jet, double-jet or controlled double-jet method. About 10 to 200 g of the protective colloid is used per kilogram of the emulsion. The silver halide emulsion may incorporate a small amount of a hardener of high activity such as an active vinyl compound, e.g., divinyl sulfone or methylene bismaleimide, or an active halogen compound, e.g., 2,4-dichloro-6-hydroxy-s-traizine. The emulsion may further contain a conventional additive such as a coating aid, e.g., stabilizer, antifoggant or surfactant, or a dye or pigment. If necessary, the silver halide emulsion layer may also incorporate hydroquinone, its derivative, catechol, its derivative, pyrogallol or its derivative in the form of a dipersion.

Accordng to a particularly preferred embodiment of this invention, a photosensitive silver halide emulsion layer is directly formed on the non-silver photosensitive layer described above, and fine particles of an oily or waxy compound substantially insoluble in water are dispersed in the emulsion layer. The "oily or waxy compound substantially insoluble in water" refers to hydrophobic compounds that are substantially insoluble in water and which are liquid either independently or as a mixture at ordinary temperture, e.g., 24° C., or a temperature at which the photosensitive silver halide emulsion layer is applied (e.g., 50° C.), and preferably they are liquid at ordinary temperature and have a boiling point of at least about 120° C., preferably at least about 150° C. The advantages of this invention resulting from compounds of high degree of hydrophobicity are greater than those obtained from compounds of low hydrophobicity because they are more easy to be dispersed as fine particles. Illustrative compounds of high degree of hydrophobicity include diethyl adipate, dibutyl adipate, diisobutyl adipate, di-n-hexyl adipate, dioctyl adipate, dicyclohexyl azelate, di-2-ethylehexyl azelate, dioctyl sebacate, diisooctyl sebacate, dibutyl succinate, octyl stearate, dibenzyl phthalate, tri-o-cresyl phosphate, diphenyl-mono-p-tert-butylphenyl phosphate, monophenyl-di-o-chlorophenyl phosphate, monbutyldioctylphosphate, 2,4-di-n-amylphenol, 2,4-di-tertamylphenol, 4-n-nonylphenol, 2-methyl-4-n-octylphenol, N,N-diethylcarprylamide N,N-diethyllaurylamide glycerol tripropionate, glycerol tributylate, glycerol monolactate diacetate, tributyl citrate, acetyltriethyl citrate, di-2-ethylhexyl adipate, dioctyl sebacate, diisooctyl azelate, diethylene glycol dibenzoate, dipropylene glycol dibenzoate, triethyl citrate, tri(2-ethylhexyl)citrate, acetyl tri-n-butyl citrate, di(isodecyl)-4,5-epoxytetrahydrophthalate, oligovinyl ethyl ether, dibutyl fumarate, polyethylene oxide (n=16), glycerol tributyrate, ethylene glycol dipropionate, di(2-ethylhexyl)isophthalate, butyl laurate, tri(2-ethylhexyl)phosphate, triphenyl phosphate, tricresyl phosphate, silicone oil, dimethyl phthalate, diethyl phthalate, dipropyl phthalate, dibutyl phthalate, diisooctyl phthalate, diamyl phthalate, di-n-octyl phthalate, diamyl naphthalene, triamylnaphthalene, monocaprin, monolaurin, monomyristin, monopalmitin, monostearin, monoolein, dicaprin, dilaurin, dimyristin, dipalmitin, distearin, diolein, 1-stearo-2-palmitin, 1-palmito-3-stearin, 1-palmito-2-stearin, triacetin, tricaprin, trilaurin, trimyristin, tripalmitin, tristearin, triolein, tripetroselin, trierucin, triricinolein, linoleodistearin, linoleodilinolenin, oleodierucin, linoleodierucin, palmitooleolinolenin, paraffin; drying oils such as linseed oil, perilla oil, tung oil, hempseed oil, kaya oil, walnut oil, soybean oil, soya sauce oil, poppy seed oil, sunflower oil, catalpa oil, arrowhead oil and safflower oil; semi-drying oils such as cotton seed oil, corn oil, sesami oil, rape oil, rice bran oil, croton oil, mustard oil, kapol oil, and dehydrate castor oil; peanut oil, olive oil, tsubaki oil, sasanqua oil, tea seed oil, castor oil, hydrogenated castor oil, almond oil and hydnocarpus oil. Particulary preferred compounds are those having a melting point of about 50° C. or lower either independently or as a mixture.

These compounds are well known, and they are described in, for example, U.S. Pat. Nos. 2,322,027, 2,533,514, 2,588,765, 2,960,404, 3,121,060, 3,287,134, German Pat. No. 1,152,610, British Pat. Nos. 955,061, 1,272,561, Japanese Patent Publication No. 21766/68, Japanese Patent Application (OPI) No. 14322/73, and Kuwata, *Yushi Kagaku* (*Chemistry of Fat and Oil*), Iwanami Publishing Company, 1968, Tokyo. Esters of adipic acid, phthalic acid, succinic acid, fumaric acid, azelaic acid, isophthalic acid and phosphoric acid and esters of glycerin are used with advantages because they have no adverse effect on photographic sensitive materials, are easily available and are easy to handle because of their chemical stability.

More preferred compounds are polyester compounds that are to be defined hereinafter. Compared with the compounds mentioned above, the polyester compounds to be defined hereinafter are easy to disperse as fine particles in a hydrophilic colloid, stable, provide very intimate contact between the lipophilic layer and the hydrophilic colloid layer, and provide a lithographic printing plate having an image area of high lipid sensitivity. The polyester compounds to be used in this invention are oily or waxy at ordinary temperature and have a boiling point of at least about 120° C. Such polyester compounds are obtained by condensation polymerization of a polyhydric alcohol and a polybasic acid and/or oxyacid.

Illustrative polyhydric alcohols for use in this invention include ethylene glycol, diethylene glycol, triethylene glycol, polyethylene glycol (average molecular weight of 200 to 1,000), 1,2-propylene glycol, 1,3-propylene glycol, polypropylene glycol (average molecular weight of 170 to 1,000), trimethylolethane, trimethylolpropane, 1,4-butanediol, isobutylene diol, dioxyacetone, 1,5-pentanediol, neopentyl glycol, 1,6-hexanediol, 1,7-heptanediol, 1,8-octanediol, 1,9-nonanediol, 1,10-decanediol, 1,11-undecanediol, 1,12-dodecanediol, 1,13-tridecanediol, cis- and transcyclohexane-1,4-diol, glycerin, diglycerin, triglycerin, 1-methylglycerin, erythrite, pentaerythrite, dipentaerythrite, mannitol, sorbitol, bisphenol A, 1,4-bis($\beta$-hydroxyethoxy)benzene, and 1,4-bis($\beta$-hydroxyethoxy)-cyclohexane.

Illustrative polybasic acids include oxalic acid, malonic acid, succinic acid, glutaric acid, dimethylmalonic acid, adipic acid, pimelic acid, cork acid, $\alpha,\alpha$-dimethylsuccinic acid, acetylmalic acid, acetonedicarboxylic acid, azelaic acid, sebacic acid, nonanedicarboxylic acid, decanedicarboxylic acid, undecanedicarboxylic acid, dodecanedicarboxylic acid, fumaric acid, maleic acid, dimer acid, itaconic acid, citraconic acid, phthalic acid, isophthalic acid, tetrachlorophthalic acid, mesaconic acid, isopimelic acid, aconitic acid, acetylenedicarboxylic acid, glutaconic acid, camphoric acid, cyclopentadiene-maleic anhydride adduct, terpene-maleic anhydride adduct, and rosin-maleic anhydride adduct.

Illustrative oxyacids include β-propiolactone, γ-butyrolactone, γ-valerolactone, hydroacrylic acid, citric acid, lactic acid, tartaric acid, malic acid, oxyisobutyric acid, γ-oxybutyric acid, aconic acid, ascorbic acid, tetronic acid, paraconic acid, citramalic acid, monoethyl tartarate, glycolic acid, glyceric acid, oxybenzoic acid, oxycinnamic acid, oxynaphthoic acid, and gallic acid.

The polyester compound to be used in this invention is produced by performing condensation polymerization of at least one polyhydric alcohol and at least one polybasic acid and/or at least one oxyacid.

Polyester compounds that are particularly effective for use in this invention are polyesters of aliphatic saturated dicarboxylic acids of the formula: $HOOC-(CH_2)_n-COOH$ (n=4 to 8) and polyhydric alcohols such as ethylene glycol, diethylene glycol, trimethylolpropane, neopentyl glycol and pentaerythritol; such polyesters have a molecular weight of from 1,000 to 3,000. Specific examples of such polyesters are as follows:

1. Diethylene glycol-adipic acid polyester
2. Trimethylolpropane-adipic acid-phthalic acid polyester
3. Diethylene glycol-trimethylolpropane-adipic acid polyester
4. Ethylene glycol-adipic acid polyester
5. 1,4-Butanediol-adipic acid polyester
6. Ethylene glycol-1,4-butanediol-adipic acid polyester
7. Neopentyl glycol-1,6-hexaneglycol-adipic acid polyester
8. Ethylene glycol-propylene glycol-adipic acid polyester
9. 1,6-Hexaneglycol-propylene glycol-adipic acid polyester
10. Ethylene glycol-succinic acid polyester
11. Ethylene glycol-sebacic acid polyester
12. Ethylene glycol-azelaic acid polyester
13. Diethylene glycol-trimethylolpropane-adipic acid polyester
14. Bisphenol A-adipic acid polyester
15. Glycerin-maleic acid polyester
16. Ethylene glycol-acetylenedicarboxylic acid polyester
17. Propylene glycol-adipic acid-γ-butyrolactone polyester
18. 1,4-Butanediol-malic acid-succinic acid polyester
19. Ethylene glycol-tartaric acid-glycolic acid polyester
20. 1,4-Bis(β-hydroxyethoxy)cyclohexane-adipic acid polyester
21. 1,4-Butanediol-β-propiolactone-succinic acid-adipic acid polyester
22. 1,4-Bis(β-hydroxyethoxy)benzene-sebacic acid polyester
23. Neopentyl glycol-citric acid-adipic acid polyester
24. 1,6-Hexanediol-ascorbic acid-sebacic acid polyester
25. Adeka Sizer-P-200 (product of Adeka Argus Chemical Co., Ltd.) (m.w.: ca. 2,000, acid value: less than 3.5, saponification value: 505–530)
26. Adeka Sizer-P-300 (product of Adeka Argus Chemical Co., Ltd.) (m.w.: ca. 3,000, acid value: less than 3.5, saponification value: 535–550)

These polyester compounds are effective in achieving the object of this invention. Particularly effective polyhydric alcohols are glycols of the formula: $HO-R_1-OH$ (wherein $R_1$ is a hydrocarbon chain having 2 to about 12 carbon atoms) or polyalkylene glycol, and particularly effective polybasic acids are those having the formula: $HOOC-R_2-COOH$ (wherein $R_2$ is a hydrocarbon having 0 to 12 carbon atoms). Polyester compounds produced by condensing these polyhydric alcohols and polybasic acids provide good results.

The polyester compounds to be used in this invention are not only commercially available but also they are easily synthesized by the method described in W. R. Sorenson and T. W. Campbell, *Kobunshi Gosei Jikkenho* (original title: *Preparative Methods of Polymer Chemistry*), translated by Toshio Hoshino and Naoya Yoda, Tokyo Kagaku Dojin, pp. 102 and 118.

Such polyester compounds may be used independently or as a mixture. They may also be used in combination with another polymer having affinity for organic solvents, such as phenolic resins of the type described in Japanese Pat. Application No. 74258/79, shellac, polyamide resins, polyvinyl acetal resins, polyurethane resins and epoxy resins. The ratio of these additional polymers to the polyester compound is preferably in the range of from 0.2:0.8 to 0.8:0.2.

The oily or waxy compound according to this invention is dispersed as fine particles in a hydrophilic colloid. To make fine particles of the oily or waxy compound, the compound is preferably dissolved first in an organic solvent the solubility of which in water is less than 10 wt% and then dispersed in a hydrophillic colloid with the aid of an anionic surfactant such as sodium alkylbenzenesulfonate, taurine derivative or sulfonated oil. Suitable hydrophilic colloids are polyvinyl pyrrolidone, polyvinyl imidazole, polyvinyl alcohol, polyacrylamide and copolymers thereof. Particularly preferred are gelatin or gelatin derivatives of the type described in U.S. Pat. Nos. 2,614,928, 2,763,639, 3,118,766, 3,132,945, Japanese Pat. Publication Nos. 5514/64 and 26845/67.

The oily or waxy compound according to this invention is preferably dispersed in a hydrophilic colloid as particles having a size of from 0.01 to 10 microns. The fine particles of such compound can be contained in the photosensitive silver halide emulsion layer in an amount of from about 0.1 to about 20 parts by weight, preferably from 1 to 10 parts by weight, and more preferably from 2 to 5 parts by weight, based on 10 parts by weight of the hydrophilic colloid.

the advantages of incorporating a dispersion of fine particles of an oily or waxy compound in a silver halide emulsion layer include the remarkable increased film strength of the layer (hence, the layer becomes less likely to be impaired physically) and the reduced stickiness of the layer (hence, the layer becomes less likely to be stained with fingerprints or becomes free from blocking). With fine particles of waxy or oily compound being dispersed in the layer, the photosentitive layer containing silver halide becomes relatively free from fog formation due to application of pressure or from static marks produced by a discharge of static electricity. Other advantages are that the use of a lipid-sensitive resin is not accompanied by harmful effects, such as retarded development or increased chances of stain formation. I spite of the intimate contact provided between the silver halide emulsion layer and the non-silver photosensitive layer capable of forming lipophilic image, the photosenitive lithographic printing plate precursor according to this invention can provide a printing plate that has an image area of high lipid sensitivity and a non-image area that is less likely to form stain.

In another particularly preferred mode of this invention, a photosensitive silver halide emulsion layer is disposed on a non-silver photosensitive layer made of the composition described above and fine particles of a substantially water-insoluble lipophilic resin are dispersed in said silver halide emulsion layer. A "lipophilic resin" is such that when its coating is applied to a support in a thickness of about 2 microns or more (the coated support is referred to as a specimen), the surface of the resin layer forms a substantially positive angle of contact with the support. As suggested by Mitsuo Obana in "Wetting on a Lithographic Printing Plate", *Insatsu Zasshi* (*Journal of Printing*), Vol. 25, October issue, 1968, the angle of contact is defined as $\theta = -[\theta o/w - \theta w/o]$ wherein $\theta o/w$ is the angle of contact of kerosine in water as measured with a goniometer by the "captive bubble method" wherein fine particles (bubbles) of kerosine are brought into contact with the surface of the specimen immersed in water at 24° C., and $\theta w/o$ is the angle of contact of water in kerosine as measured with a goniometer likewise bringing fine particles (bubbles) of water into contact with the surface of the specimen immersed in kerosine. Examples of such substantially water-insoluble lipophilic resins are those which were mentioned as materials for the binder to be used in the non-silver photosensitive layer described above; for instance, shellac, polyamide resins, phenolic resins, polyvinyl acetal resins, linear polyurethane resins, phenolic novolak resins and polyester resins can be used. Besides these resins, polyvinyl cinnamate resins and photosensitive polymers such as photosensitive polyester can also be used. The following resins A, B and C are particularly preferred. A: Resins having a repeating unit of the following formula (I),

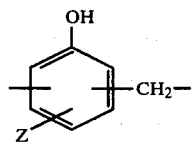

wherein Z is a hydrogen atom, halogen atom, alkyl group having 1 to 4 carbon atoms, alkoxy group having 1 to 4 carbon atoms, or carbosyl group;
B: Resins formed by polycondensation of polyvalent phenol and ketone having 3 to 5 carbon atoms;
C: Resins having a repeating unit of the following formula (II),

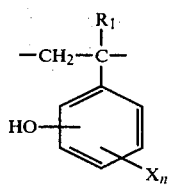

wherein $R_1$ is a hydrogen atom or an alkyl group having 1 to 4 carbon atoms, X is a halogen atom, and n is 1 or 2.

Specific examples of the resin (C) include polymers of hydroxystyrenes as hydroxystyrene, chlorohydroxystyrene, bromohydroxystyrene, dibromohydroxystyrene and hydroxy-α-methylstyrene, copolymers with other monomers, and modified products of these polymers.

Illustrative monomers copolymerizable with the hydroxystyrenes mentioned above include styrene, maleic anhydride, acrylonitrile, acrylic acid, methacrylic acid, ethyl acrylate, butyl acrylate, methyl acrylate, and hydroxyethyl methacrylate.

Illustrative modified products of polymers or copolymers of hydroxystyrene include those wherein a hydorxyl group is esterified with an acid anhydride or acid halide (e.g., acetic anhydride, propionyl chloride, pivaloyl chloride, or benzoyl chloride), or etherified with an epoxy compound (e.g., glycidyl butyl ether or glycidyl tolyl ether), or urethanated with an isocyanate compound (e.g., phenyl isocyanate or hexamethylene diisocyanate). Preferably, these modified products contain at least 50 mol% of the unit represented by formula (II). The polymers have an average molecular weight of from about 500 to about 50,000, and preferably from about 1,000 to about 20,000.

These polymers of hydroxystyrenes can be synthesized by the methods described in *J. Polym. Sci.*, A-1, 7 2175 (1969), Japanese Patent Application (OPI) Nos. 113305/75, 61643/78, and *Maruzen Sekiyu Gijutsu Hokoku* (*Maruzen Sekiyu Technical Report*), 21 1 (1976) or similar methods. Some of these polymers are commercially available.

Specific examples of the resin (B) include phenol/ketone resins; effective polyvalent phenols are resorcin, catechol and pyrogallol, and effective aliphatic ketones are acetone and methyl ethyl ketone.

These polymers have an average molecular weight of from about 500 to about 5,000 and can be synthesized by the methods described in *Ind. Eng. Chem.*, Vol. 52, p. 324 (1960) and Japanese Patent Publication No. 28403/68, or similar methods.

Also effective are modified phenol/ketone resins wherein a hydroxyl group is modified in the same manner as in the case of the polymers of hydroxystyrenes. Modified phenol/ketone resins preferably retain about half of the hydroxyl groups contained in the unmodified resins.

The resin (A) includes, for example, phenolic novolak resins and cresol resins, and can be synthesized by well known methods.

Of the resins (A), (B) and (C), resin (A) is particularly preferred.

These resins are contained in the photosensitive silver halide emulsion in the form of fine particles. To provide the fine particles of the resin, it is dissolved in an organic solvent whose solubility in water is not more than 10 wt% and is then dispersed in a hydrophilic colloid with the aid of an anionic surfactant such as sodium alkylbenzenesulfonate, taurine derivative or Turkey red oil. Illustrative hydrophilic colloids are polyvinyl pyrrolidone, polyvinyl imidazole, polyvinyl alcohol, polyacrylic acid amide, and copolymers thereof, and gelatin or their derivatives. Particularly preferred are gelatin and derivatives thereof of the types described in U.S. Pats. Nos. 2,614,928, 2,763,639, 3,118,766, 3,132,945, and Japanese Patent Publication Nos. 5514/64 and 26845/67. These colloids may be used in combination with a high-boiling plasticizer such as tricresyl phosphate, dioctyl butyrate or dodecyl succinic acid ester.

The lipophilic resins are preferably dispersed in the hydrophilic colloid as particles having a size of from 0.01 to 10 microns. These resins can be contained in the photosensitive silver halide emulsion in an amount of from about 1 to 200 parts by weight per 100 parts by weight of the hydrophilic colloid. Preferably, they are contained in an amount of from 10 to 100, and more preferably from 20 to 50 parts by weight, per 100 parts by weight of the hydrophilic colloid.

One advantage of incorporating a lipophilic resin is greatly enhanced contact between the two layers. As another advantage, the silver halide emulsion layer containing fine particles of a lipophilic resin becomes strong (this provides a membrane less likely be impaired physically) and less sticky (this provides a membrane on which a fingerprint is scarcely left and which has blocking resistance). With these fine particles of a lipophilic resin, there is little likelihood that fog can appear on the silver halide-containing layer under pressure, or that static marks will be produced on said layer by a discharge of static electricity. As still another advantage, the incorporation of the lipophilic resin does not present harmful effects such as delayed development and increased chances of stain formation.

The coating of the photosensitive silver halide emulsion can be applied so as to be present in a dry amount of from about 1 to 10 g/m$^2$, and preferably from 2 to 6 g/m$^2$. Application may be achieved by dip coating, air-knife coating, curtain coating, or hopper coating or extrusion coating as described in U.S. Pat. No. 2,681,294.

As mentioned above, the silver halide emulsion layer applied to the first layer is dried with hot air (60°to 150° C.) without being permitted to set. According to this invention, in the initial stage of drying, hot air having a temperature between 60°and 100° C. is blown softly against the coating to increase its viscosity, and as the drying proceeds, hard blow of hot air having a temperature between 70° and 150° C. is applied to achieve gradual drying with a small temperature gradient. Dried by this method, the silver halide emulsion layer is bonded to the first layer with adequate strength.

A lithographic printing plate can be prepared from the photosensitive lithographic printing plate precursor of this invention in the following manner: first, the precursor is exposed imagewise to form a latent image in the silver halide of the silver halide-containing photosensitive layer; the silver halide is then developed (first development), and the precursor is exposed to actinic radiation including ultraviolet radiation either immediately or after treatment with a fixing solution; thereafter, the precursor is transferred to a second development stage where only the non-image area of the non-silver photosensitive layer is washed away, to provide a printing plate wherein the hydrophilic surface of the support is exposed. The processing solution used in the second development is such that it dissolves only the non-image area of the non-silver photosensitive layer, and it can be selected from developers conventionally used in processing PS plates or similar developers. For example, if the non-silver photosensitive layer comprises an o-quinonediazide compound, an aqueous solution of sodium silicate or a developer of the type described in U.S. Pat. No. 4,141,733 may be used.

Alternatively, after exposure to ultraviolet rays, the photosensitive silver halide emulsion layer may be washed away throughout or only in the non-image area before the precursor is contacted by a second developer to wash away only the non-image area.

If the precursor of this invention uses a photosensitive silver halide emulsion layer that does not contain a lipophilic resin, it is easily impaired physically by the photographic procesing described above.

This invention is now described in greater detail by reference to the following examples which are given here for illustrative purposes only and are not intended to limit the scope of the invention. In the examples, all percents are by weight.

EXAMPLE 1

A 2S aluminum plate (an aluminum alloy corresponding to JIS Standard AA1100) mechanically grained according to the method described in Japanese Patent Application (OPI) No. 33911/73 was immersed for 1 minute in a 2% aqueous solution of sodium hydroxide held at 40° C. After washing with water, the aluminum plate having part of its surface etched was immersed in a solution of sulfuric acid/chromic acid for about 1 minute to expose the surface of pure aluminum. The plate was then anodized for 2 minutes in 20% sulfuric acid (30° C.) at a voltage of 1.5 volts D.C. and a current density of 3 amperes/dm$^2$. After washing with water and drying, a coating solution of the formulation indicated below was continuously applied to the plate from an extrusion type coater to make a non-silver photosensitive layer in a dry weight of about 2 g/m$^2$.

| Sample No. | Drying Conditions | |
|---|---|---|
| | Setting Zone | Drying Zone |
| Sample (a) | 4° C., 3 min | 40° C., 10 min |
| Sample 1 | none | 60° C., 5 min |
| Sample 2 | " | 80° C., 3 min |
| Sample 3 | " | 100° C., 2 min |
| Sample 4 | " | 130° C., 1 min |
| Sample 5 | " | 150° C., 40 sec |

| | |
|---|---|
| Silver chlorobromide gelatin emulsion (silver chlorobromide comprising 70 mol % Cl and 30 mol % Br, average grain size: 0.28 μ, 55 g of gelatin and 0.85 mol of silver halide contained in 1 kg of the emulsion) | 2,000 g |
| 0.1% sodium salt of 1,3-diethyl-5-{2-[3-(3-sulfopropyl)benzoxazole-2-ylidene]-ethylidene}-thiohydantoin in methanol | 100 ml |
| 0.5% aqueous alkali solution of 4-hydroxy-6-methyl-1,3,3a,7-tetrazaindene | 200 ml |
| 2% aqueous solution of 2,4-dichloro-6-s-triazine | 70 ml |

A coating solution of Formulation (1) indicated below was continuously applied to the subbing layer with an extrusion type coater (35° C., 10 m/min) to give a uniform photosensitive layer in a dry weight of 4.0 g/m$^2$, and the plate was supplied to a dry zone and dried under the condition indicated below. The resulting precursor samples were designated Samples 1 to 5. A separately prepared plate was dried after it was permitted to set at 4° C. for 3 minutes, and the resulting precursor was designated Sample (a). The photosensitive layer of Sample (a) separated from the subbing layer during the drying step. No such defect occurred in Samples 1 to 5.

| | |
|---|---|
| Naphthoquinone-1,2-diazide(2)-5-sulfonic acid ester of acetone-pyrogallol resin (synthesized by the method of Example 1 of U.S. Pat. No. 3,635,709) | 2.5 g |
| Cresol-formaldehyde resin | 5.0 g |
| Methyl ethyl ketone | 75 g |

| | |
|---|---|
| Cyclohexanone | 60 g |

After standing at room temperature for a week, each sample was subjected to the following photomechanical processing: it was exposed through a transparent negative film of a line original (at ca. 1/5 size) for 10 seconds with an enlarger (having a 300 lux light source) at 5× magnification. The exposed sample was processed by an automatic developing machine where it was passed through a first developing section filled with a developer (I) of the formulation indicated below for 20 seconds at 32° C. and through a fixing section filled with a fixing solution (I) of the formulation indicated below for 10 seconds at room temperature. Subsequently, the sample was passed through an ultraviolet exposure section comprising three reflector mercury lamps over a period of 15 seconds and transferred to a washing section where it was immersed in hot water (40°–45° C.) and rubbed with a brush. The sample was then passed between squeeze rollers and through a second developing section filled with a developer (II) of the formulation indicated below for 30 seconds at 30° C. Finally, the sample was gummed with aqueous gum arabic (14° Be) to provide a lithographic printing plate.

| Formulation of Developer (I) | |
|---|---|
| Water | 700 ml |
| Metol | 3.0 g |
| Sodium sulfite | 45.0 g |
| Hydroquinone | 12.0 g |
| Sodium carbonate (monohydrate salt) | 80.0 g |
| Potassium bromide | 2 g |
| Water to make | 1 l |

The bulk solution of this formulation was diluted two-fold before it was used as developer (I).

| Formulation of Developer (II) | |
|---|---|
| Sodium silicate JIS No. 1 | 100 g |
| Sodium metasilicate | 50 g |
| Pure water | 1,800 ml |
| Formulation of Fixing Solution (I) | |
| Water | 700 ml |
| Ammonium thiosulfate | 224 g |
| Sodium sulfite | 20 g |
| Water to make | 1,000 ml |

After four or five sheets of paper were wasted, the lithographic printing plates prepared from Samples 1 to 5 could provide about 110,000 reproductions of good quality on a Heidel KOR printing machine.

EXAMPLE 2

To the aluminum plate prepared in the same manner in Example 1, a photosensitive solution of the formulation indicated below was continuously applied to the plate with a roll coater to form a non-silver photosensitive layer having a dry weight of about 2 g/m$^2$.

| | |
|---|---|
| Naphthoquinone-1,2-diazide(2)-5-sulfonic acid ester of acetone-pyrogallol resin (synthesized by the method of Example 1 of U.S. Pat. No. 3,635,709) | 2.5 g |
| Hitanol #3110 (a cresol-formaldehyde resin made by Hitachi Chemical Co., Ltd.) | 5.0 g |
| Methyl ethyl ketone | 75 g |
| Cyclohexanone | 60 g |

A photosensitive solution of the formulation indicated below was applied continuously to the non-silver photosensitive layer, to obtain a coating having a dry weight of about 4.5 g/m$^2$, the coating being dried with hot air (final temperature: 110° C.) without permitting the coating to be set. The resulting sample of precursor was identified by No. 1.

| | |
|---|---|
| Emulsion wherein a solution of 45 g of phenol-formaldehyde resin MP 120 HH (product of Gun-Ei Chemical Industry Co., Ltd.) in a mixture of 330 g of ethyl acetate and 120 g of methyl ethyl ketone was dispersed in a solution comprising 600 ml of 10% aqueous solution of gelatin that was blended with a mixture of 60 ml of 10% aqueous solution of sodium nonylbenzensulfonate and 150 ml of 10% solution of Turkey red oil in methanol | 1,300 g |
| Silver chlorobromide gelatin emulsion (silver chlorobromide comprising 70 mol% Cl$^-$ and 30 mol% Br$^-$, average grain size: 0.28 μ, 55 g of gelatin and 0.85 mol of silver halide contained in 1 kg of the emulsion) | 2,000 g |
| 0.1% sodium salt of 1,3-diethyl-5-{2-[3-(3-sulfopropyl)benzoxazole-2-ylidene]ethylidene}thiohydantoin in methanol | 100 ml |
| 0.5% aqueous alkali solution of 4-hydroxy-6-methyl-1,3,3a,7-tetrazaindene | 200 ml |
| 2% aqueous solution of 2,4-dichloro-6-hydroxy-s-triazine | 70 ml |

A control precursor was prepared by applying to the non-silver photosensitive layer a photosensitive solution (of the same formulation as defined above except that it did not contain the dispersion of phenolformaldehyde resin), to obtain substantially the same coating amount of silver halide, and by drying the resulting photosensitive layer with hot air (final temperature: 90° C.) without permitting to set. The precursor sample obtained was identified by (b). Sample No. 6, prepared according to this invention, had a uniform coating of silver halide-containing photosensitive layer. But in spite of the low drying temperature, partial separation of the silver halide-containing photosensitive layer was observed in Sample (b) and no uniform coating of that layer was obtained.

After standing at room temperature for a week, both Samples No. 6 and (b) were subjected to the following photomechanical processing: each sample was exposed through a transparent negative film of a line original (at about 1/5 size ) for 10 seconds with an enlarger (having a 300 lux light source) at 5x magnification.

Each exposed sample was processed by an automatic developing machine wherein each sample was passed through a developer (I) (of the formulation indicated below) for 20 seconds at 32° C., and through a fixing solution (I) (of the formulation indicated below) for 10 seconds at 20° C. Subsequently, the samples were passed through an ultraviolet exposure section comprising three reflector mercury lamps over a period of 15 seconds, and transferred to a washing section where they were immersed in hot water (40°–45° C.) and rubbed with a brush. They were then passed between squeeze rollers and through a developer (II) (of the formulation indicated below) for 30 seconds at 30° C. Finally, aqueous gum arabic solution (14° Be) was applied to each sample with a gum coater 800 G (product of Fuji Photo Film Co., Ltd.) to prepare a lithographic printing plate.

| Formulation of Developer (I) | |
|---|---|
| Water | 700 ml |
| Metol | 3.0 g |
| Sodium sulfite | 45.0 g |
| Hydroquinone | 12.0 g |
| Sodium carbonate (monohydrate salt) | 80.0 g |
| Potassium bromide | 2 g |
| Water to make | 1 l |

The bulk solution of this formulation was diluted two-fold before it was used as developer (I).

| Formulation of Developer (II) | |
|---|---|
| Sodium silicate JIS No. 1 | 100 g |
| Sodium metasilicate | 50 g |
| Pure water | 1,800 ml |
| Formulation of Fixing Solution (I) | |
| Water | 700 ml |
| Ammonium thiosulfate | 224 g |
| Sodium sulfite | 20 g |
| Water to make | 1,000 ml |

After five sheets of paper were wasted, Sample No. 6 could provide about 110,000 reproductions of good quality on a Heidel KOR printing machine. Sample (b) produced many line images worn out by abrasion. It also formed stain due to edge fogging that occurred when the raw sample was cut into suitable lengths.

EXAMPLE 3

Similar results (viz., 100,000 reproductions, after initially eight sheets were wasted) to those of Example 2 were obtained when an experiment identical to that of Example 1 was performed, except for the substitution of 40 g of diethylene glycol-trimethylolpropane-adipic acid polyester for the 45 g of phenol-formaldehyde resin mixed with 330 g of ethyl acetate and 120 g of methyl ethyl ketone used in the photosensitive solution formulation of Example 1.

EXAMPLE 4

A 2S aluminum plate mechanically grained according to the method described in Japanese Patent Application (OPI) No. 3391/73 was immersed for 1 minute in a 2% aqueous solution of sodium hydroxide held at 40° C. After washing with water, the aluminum plate having part of its surface etched was immersed in a solution of sulfuric acid/chromic acid for about 1 minute to expose the surface of pure aluminum. The plate was then anodized for 2 minutes in 20% sulfuric acid (30° C.) at a voltage of 15 volts D.C. and a current density of 3 amperes/dm$^2$. After washing with water, the anodized plate was immersed in 10% phosphoric acid at 50° C. for 30 seconds, washed with water again, immersed in a 2% solution of sodium silicate (JIS No. 3) for 2 minutes at 70° C., washed with water and dried with heat. After cooling the aluminum plate to room temperature, a solution for subbing layer of the formulation indicated below was applied to the plate with a roll coater.

| Polyvinyl pyrrolidone K-90 (product of Badische Anilin and Soda Fabrik Co.) | 2.5 g |
|---|---|
| Methyl alcohol | 1,000 ml |

After the application, the plate was dried at 100° C. for 2 minutes and coated with a non-silver photosensitive layer from a photosensitive solution of the following formulation.

| Polyester prepared by condensing p-phenylenediethoxyacrylate with an equal mol of 1,4-β-hydroxyethoxy-cyclohexane | 115 g |
|---|---|
| 2-Benzoylmethylene-3-methyl-β-naphthothiazoline | 5.7 g |
| Dibutyl phthalate | 48 g |
| 4,4'-thiobis(3-methyl-6-tertiary-butylphenol) | 2.5 g |
| Phthalocyanine Blue (C.I. Pigment Blue #15) | 25 g |
| Monochlorobenzene | 1,880 g |
| Ethylene dichloride | 1,220 g |

The plate was then dried at 100° C. for 2 minutes. The dry weight of the non-silver photosensitive layer was 1.2 g/m$^2$.

A precursor was prepared by applying to the non-silver photosensitive layer a photosensitive solution (of the same formulation as used in Example 1 except that 45 g of the phenol-formaldehyde resin was replaced by 60 g of a phenolic resin) to give a dry coating weight of 4.0 g/m$^2$ and by drying the resulting photosensitive layer with hot air (final temperature: 90° C.) without permitting to set. The precursor sample obtained was identified by No. 2.

After standing at room temperature for 10 days, the sample was exposed through a transparent positive film of a line original (at about ¼ size) with an enlarger (having a 300 lux light source) at 4× magnification, and the exposed sample was subjected to the same photomechanical processing as Example 1, except that developer (II) as the second developing solution was replaced by a 90% aqueous solution of lactic acid. After 30-second development, aqueous gum arabic solution (14° Be) was applied to the sample to prepare a lithographic printing plate.

Ten thousand reproductions on wood-free paper were obtained with a Roland printing machine. All reproductions were characterized by good receptivity to printing ink, high degree of hydrophilicity at the non-image area, and good tone reproduction of line images.

EXAMPLE 5

Samples 7, 8 and 9 were prepared in the same manner as in the preparation as the sample of Example 3, except that the emulsion thereof was replaced by 1,300 g each of emulsions II, III and IV, respectively, which were produced in the following manner.

Emulsion II: A mixture of 20 g of a polyester compound mentioned first in the list of illustrative polyester compounds and 25 g of a phenol-formaldehyde resin MP 120 HH (product of Gun-Ei Chemical Industry Co., Ltd.) was dissolved in a mixture of 330 g of ethyl acetate and 120 g of methyl ethyl ketone, and the solution was dispersed in 600 ml of 10% aqueous solution of gelatin containing 60 ml of 10% solution of sodium nonylbenzenesulfonate and 150 ml of 10% solution of Turkey red oil in methanol.

Emulsion III: A mixture of 20 g of dioctyl adipate and 25 g of a phenol-formaldehyde resin MP 120 HH was treated in the same manner as in the preparation of Emulsion II. Emulsion IV: A solution of 40 g of tricresyl phosphate in 400 g of ethyl acetate was treated in the same manner as in the preparation of Emulsion II.

These samples were processed in the same manner as the sample in Example 3, and the resulting printing plates were used for printing. The results were as follows:

|  | Number of sheets wasted before reproduction of good quality was given. | Press Life | Abrasion | Edge Fog |
|---|---|---|---|---|
| Sample 7 | 4 | ca. 110,000 | none | none |
| Sample 8 | 6 | " | " | " |
| Sample 9 | 8 | " | slight | " |

While the invention has been described in detail and with reference to specific embodiments thereof, it will be apparent to one skilled in the art that various changes and modifications can be made therein without departing from the spirit and scope thereof.

What is claimed is:

1. A process for preparing a photosensitive lithographic printing plate precursor comprising a support having a hydrophilic surface and having thereon, in sequence, a non-silver photosensitive layer capable of forming a lipophilic image, and a photosensitive silver halide emulsion layer, the coating of the silver halide emulsion is applied to said non-silver photosensitive layer and dried using hot air at 60° to 150° C. without permitting the coating to set.

2. The process of claim 1, wherein said silver halide emulsion further contains fine particles of substantially water-insoluble oily or waxy compound or lipophilic resin in uniformly dispersed state.

3. The process of claim 2, wherein said fine particles consists of an oily or waxy compound.

4. The process of claim 2, wherein said fine particles consists of a lipophilic resin.

5. The process of claim 4, wherein said lipophilic resin is at least one compound selected from the group consisting of resins A, B and C, wherein A is a resin having a repeating unit of the formula (I):

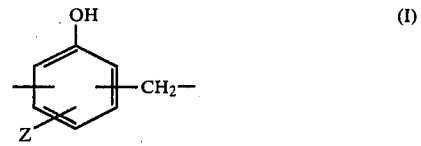

wherein Z is a hydrogen atom, a halogen atom, an alkyl group having from 1 to 4 carbon atoms, an alkoxy group having from 1 to 4 carbon atoms, or a carboxyl group;

B is a resin produced by the polycondensation of a polyvalent alcohol and a ketone having 3 to 5 carbon atoms; and C is a resin having a repeating unit of the formula (II):

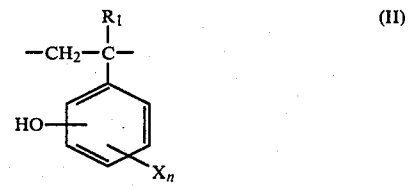

wherein $R_1$ is a hydrogen atom, or an alkyl group having 1 to 4 carbon atoms; X is a halogen atom, n is 1 or 2; and said lipophilic resin is dispersed as particles having a size in the range of from about 0.01 to 10 microns and being contained in an amount ranging from 1 to 200 parts by weight per 100 parts by weight of said hydrophilic colloid layer.

6. The process of claim 5, wherein said lipophilic resin has a repeating unit of the formula (I):

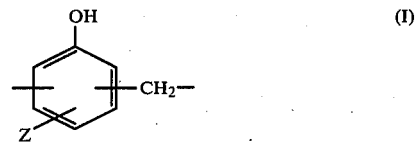

wherein Z is a hydrogen atom, a halogen atom, an alkyl group having from 1 to 4 carbon atoms, an alkoxy group having from 1 to 4 carbon atoms, or a carboxyl group.

* * * * *